US012690222B2

(12) United States Patent
Yeong et al.

(10) Patent No.: US 12,690,222 B2
(45) Date of Patent: Jul. 21, 2026

(54) INNER SPACER LINER FOR GATE-ALL-AROUND DEVICE

(71) Applicant: Applied Materials, Inc., Santa Clara, CA (US)

(72) Inventors: Sai Hooi Yeong, Cupertino, CA (US); Liu Jiang, Dublin, CA (US); Susmit Singha Roy, Campbell, CA (US); Abhijit Basu Mallick, Sunnyvale, CA (US); Benjamin Colombeau, San Jose, CA (US); El Mehdi Bazizi, San Jose, CA (US); Balasubramanian Pranatharthiharan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 420 days.

(21) Appl. No.: 18/538,273

(22) Filed: Dec. 13, 2023

(65) Prior Publication Data

US 2024/0234531 A1 Jul. 11, 2024

Related U.S. Application Data

(60) Provisional application No. 63/438,146, filed on Jan. 10, 2023.

(51) Int. Cl.
*H10D 30/00* (2025.01)
*H10D 30/01* (2025.01)
*H10D 64/01* (2025.01)

(52) U.S. Cl.
CPC ....... *H10D 30/509* (2025.01); *H10D 30/0195* (2025.01); *H10D 64/017* (2025.01)

(58) Field of Classification Search
CPC ............ H10D 30/509; H10D 30/0195; H10D 30/67–6759; H10D 30/43–481
See application file for complete search history.

(56) References Cited

U.S. PATENT DOCUMENTS

| | | | |
|---|---|---|---|
| 10,211,307 B2 | 2/2019 | Ching et al. | |
| 10,395,973 B2 | 8/2019 | Kim et al. | |

(Continued)

FOREIGN PATENT DOCUMENTS

| | | |
|---|---|---|
| CN | 112563264 A | 3/2021 |
| TW | 202240706 A | 10/2022 |

*Primary Examiner* — Lauren R Bell
(74) *Attorney, Agent, or Firm* — SERVILLA WHITNEY LLC

(57) ABSTRACT

Semiconductor devices (e.g., gate-all-around (GAA) devices), process tools for manufacturing GAA devices and methods of manufacturing GAA devices, and inner spacer liners and inner spacers for GAA devices, are described. The methods comprise performing a chemical vapor deposition (CVD) process to form an amorphous silicon liner and an inner spacer within a superlattice structure formed on a top surface of a semiconductor substrate. The superlattice structure has a plurality of semiconductor material layers (e.g., silicon germanium (SiGe)) and a corresponding plurality of channel layers (e.g., silicon (Si)). The amorphous silicon liner is conformally formed along the GAA device, including along the recessed semiconductor material layers and the corresponding plurality of channel layers, and the inner spacer is formed directly on the amorphous silicon liner. One or more operations of the methods described herein are performed in situ in an integrated processing tool system.

20 Claims, 12 Drawing Sheets

(56)        References Cited

U.S. PATENT DOCUMENTS

| | | | |
|---|---|---|---|
| 2020/0083352 A1 | 3/2020 | Chanemougame et al. | |
| 2021/0104617 A1 | 4/2021 | Hung et al. | |
| 2022/0069135 A1* | 3/2022 | Chu | H10D 30/797 |
| 2022/0157969 A1* | 5/2022 | Yin | H10D 30/014 |
| 2022/0285533 A1* | 9/2022 | Lee | H10D 30/031 |
| 2022/0320348 A1* | 10/2022 | Chang | H10D 30/6757 |
| 2023/0017036 A1* | 1/2023 | Fan | H10D 30/797 |
| 2024/0113201 A1* | 4/2024 | Wang | H10D 64/017 |
| 2025/0022957 A1* | 1/2025 | Lin | H10D 30/797 |

* cited by examiner

100

400

INNER SPACER LINER FOR GATE-ALL-AROUND DEVICE

CROSS-REFERENCE TO RELATED APPLICATIONS

This application claims priority to U.S. Provisional Application No. 63/438,146, filed Jan. 10, 2023, the entire disclosure of which is hereby incorporated by reference herein.

TECHNICAL FIELD

Embodiments of the disclosure generally relate to semiconductor devices. More particularly, embodiments of the disclosure are directed to gate-all-around (GAA) devices and methods of forming GAA devices having an inner spacer liner.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate-all-around (hGAA) structure. The hGAA device structure includes several lattice matched channels suspended in a stacked configuration and connected by source/drain regions. The hGAA structure provides good electrostatic control and can find broad adoption in complementary metal oxide semiconductor (CMOS) wafer manufacturing.

One of challenges in CMOS wafer manufacturing (and GAA formation) is reducing parasitic capacitance. The selective-etch process used to create the indent/cavity for inner spacer formation is extremely challenging and, as a result of the selective-etch process, there is unavoidable silicon (Si) loss at the indent/cavity corner of semiconductor material layers. The silicon (Si) loss reduces the current pathway and may even lead to current crowding if corner silicon (Si) loss is not engineered properly. Additionally, direct current (DC) performance is degraded significantly with silicon (Si) loss. DC performance is further degraded for thinner channel layers.

Accordingly, there is a need for methods of reducing the amount of silicon (Si) loss in gate-all-around (GAA) devices.

SUMMARY

One or more embodiments of the disclosure are directed to a method of manufacturing an electronic device. In some embodiments, the method comprises: forming a superlattice structure on a top surface of a semiconductor substrate, the superlattice structure comprising a plurality of semiconductor material layers and a corresponding plurality of channel layers alternatingly arranged in a plurality of stacked pairs; recessing a portion of the plurality of semiconductor material layers to form recessed semiconductor material layers; forming an amorphous silicon liner conformally along the electronic device, including along the recessed semiconductor material layers and the corresponding plurality of channel layers; and forming an inner spacer directly on the amorphous silicon liner, wherein the inner spacer is adjacent a source region and a drain region.

Additional embodiments of the disclosure are directed to a method of manufacturing a gate-all-around (GAA) device. In some embodiments, the method comprises: precleaning a semiconductor substrate, the semiconductor substrate having a superlattice structure formed on a top surface thereof. The superlattice structure comprises a plurality of recessed semiconductor material layers and a corresponding plurality of channel layers alternatingly arranged in a plurality of stacked pairs. The plurality of semiconductor material layers comprises silicon germanium (SiGe) and the corresponding plurality of channel layers comprises silicon (Si). The method further comprises performing a chemical vapor deposition process (CVD) to form an amorphous silicon liner and an inner spacer within the superlattice structure. In some embodiments, the amorphous silicon liner is conformally formed along the GAA device, including along the recessed semiconductor material layers and the corresponding plurality of channel layers, and the inner spacer is formed directly on the amorphous silicon liner, the inner spacer adjacent a source region and a drain region. The method further comprises etching a portion of the inner spacer; and removing a replacement metal gate and the recessed semiconductor layers from the semiconductor substrate, followed by etching an inner sidewall portion of the amorphous silicon liner.

Further embodiments of the disclosure are directed to a processing tool. In some embodiments, the processing tool comprises: a central transfer station comprising a robot configured to move a semiconductor substrate; a plurality of process stations, each process station connected to the central transfer station and providing a processing region separated from processing regions of adjacent process stations, the plurality of process stations comprising a preclean chamber and a chemical vapor deposition (CVD) chamber; and a controller connected to the central transfer station and the plurality of process stations. The controller is configured to activate the robot to move the semiconductor substrate between process stations, and to control a process cycle for forming an amorphous silicon liner for a gate-all-around (GAA) device. The process cycle comprises precleaning the semiconductor substrate, the semiconductor substrate having a superlattice structure formed on a top surface thereof, the superlattice structure comprising a plurality of recessed semiconductor material layers and a corresponding plurality of channel layers alternatingly arranged in a plurality of stacked pairs, the plurality of semiconductor material layers comprising silicon germanium (SiGe) and the corresponding plurality of channel layers comprising silicon (Si). The process cycle further comprises performing a chemical vapor deposition (CVD) process to form an amorphous silicon liner and an inner spacer within the superlattice structure, the amorphous silicon liner conformally formed along the GAA device, including along the recessed semiconductor material layers and the corresponding plurality of channel layers, the inner spacer formed directly on the amorphous silicon liner, the inner spacer adjacent a source region and a drain region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
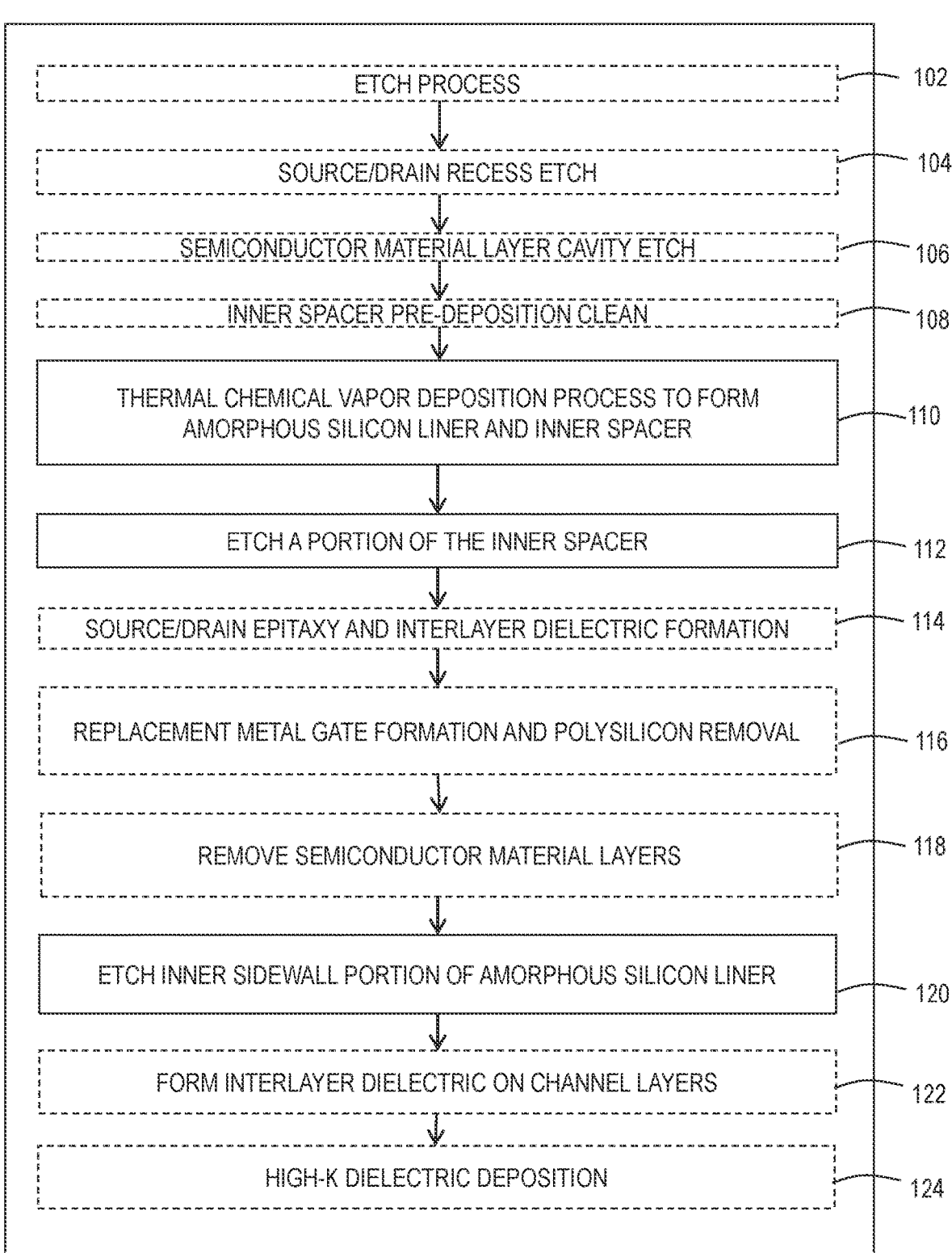
FIG. 1 illustrates a process flow diagram of a method of forming an electronic device according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers and may be referred to as "semiconductor substrates". Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor," "reactant," "reactive gas" and the like are used interchangeably to refer to any gaseous species that can react with the substrate surface.

As used herein, the term "in situ" refers to processes that are all performed in the same processing chamber or within different processing chambers that are connected as part of an integrated processing system, such that each of the processes are performed without an intervening vacuum break. As used herein, the term "ex situ" refers to processes that are performed in at least two different processing chambers such that one or more of the processes are performed with an intervening vacuum break. In some embodiments, processes are performed without breaking vacuum or without exposure to ambient air.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated ID. Drain-to-source voltage is designated VDs. By applying voltage to gate (G), the current entering the channel at the drain (i.e., ID) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (Fin-FET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs, or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer (10-9 meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a process flow diagram of a method 100 for forming an electronic device (e.g., a gate-all-around (GAA) device) in accordance with some embodiments of the present disclosure. The method 100 is described below with respect to FIGS. 2A-2J, which depicts the stages of fabrication of semiconductor structures in accordance with some embodiments of the present disclosure. FIGS. 2A-2J illustrate cross-sectional views of the GAA device according to one or more embodiments. The method 100 may be part of a multi-step fabrication process of a semiconductor device. Accordingly, the method 100 may be performed in any suitable process chamber coupled to a cluster tool, such as processing system 400 shown in FIG. 3. The processing system 400 may include process chambers for fabricating a semiconductor device, such as chambers configured for precleaning, etching, deposition, physical vapor deposition (PVD), chemical vapor deposition (CVD), such as thermal CVD, epitaxial growth, oxidation, or any other suitable chamber used for the fabrication of a semiconductor device.

Figure 2A:
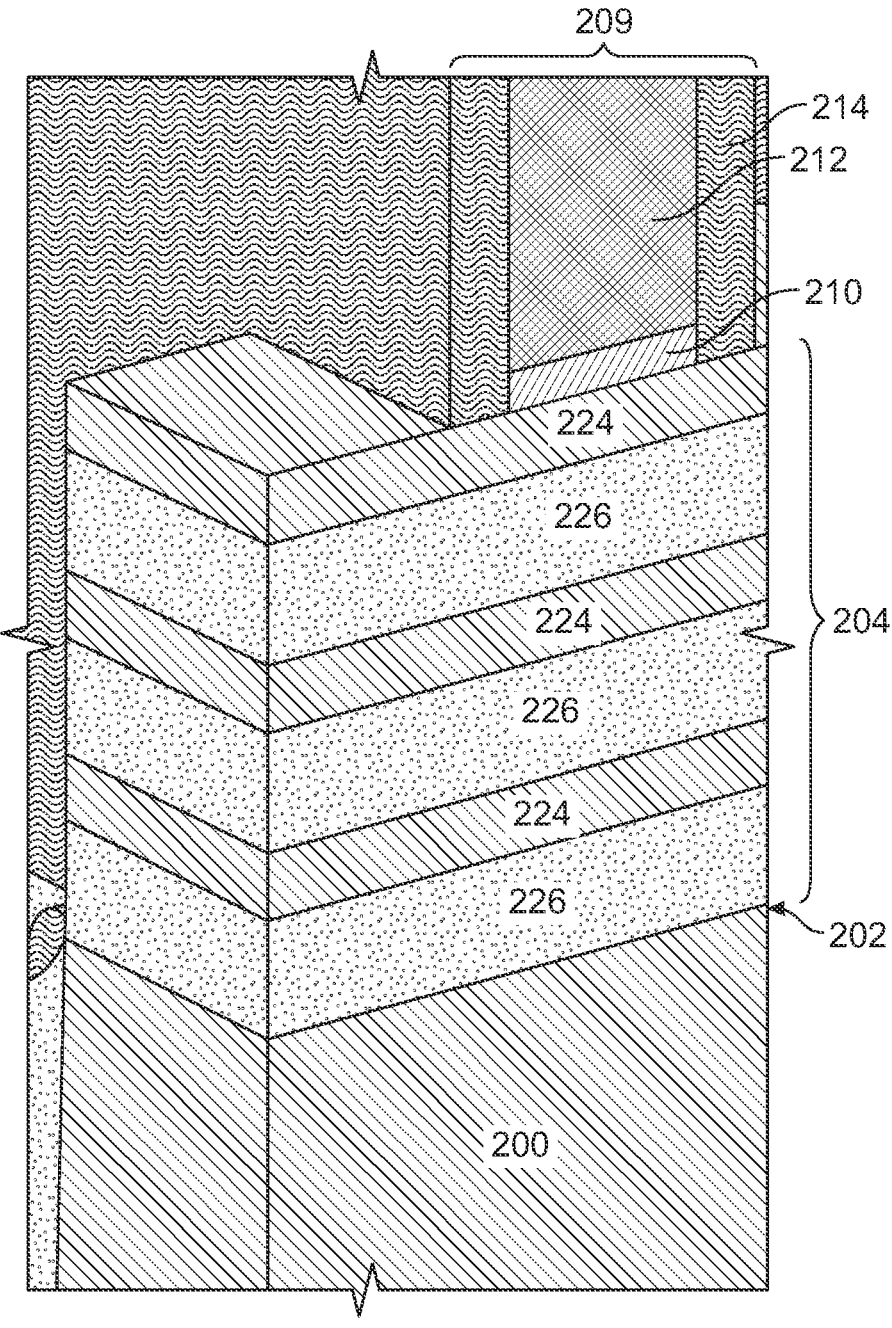
FIG. 2A illustrates a schematic cross-sectional view of an electronic device according to one or more embodiments.

FIG. 2A illustrates a semiconductor substrate 200 having a top surface 202. As used herein, the terms "semiconductor substrate 200" and "substrate 200" may be used interchangeably. The method 100 optionally includes one or more etch processes (operation 102), described further below, to form the substrate 200 shown in FIG. 2A. In some embodiments, the substrate 200 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 200 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 200 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In some embodiments, the substrate 200 may be doped to provide a high dose of dopant at a first location of the surface of the substrate 200 in order to prevent parasitic bottom device turn on.

At least one superlattice structure 204 is formed atop the top surface 202 of the substrate 200. The superlattice structure 204 comprises a plurality of semiconductor material layers 226 and a corresponding plurality of channel layers 224 alternatingly arranged in a plurality of stacked pairs. As used herein, the terms "semiconductor material layers 226" and "dummy semiconductor layers 226" may be used interchangeably. In some embodiments the plurality of stacked groups of layers comprises a silicon (Si), germanium (Ge), or silicon germanium (SiGe) group. In some embodiments, the silicon germanium (SiGe) may contain germanium (Ge) in a mole fraction amount in a range of from 0% to 50%. In some embodiments, the plurality of semiconductor material layers 226 comprises silicon germanium (SiGe), and the plurality of channel layers 224 comprises silicon (Si). In some embodiments, the plurality of semiconductor material layers 226 and corresponding plurality of channel layers 224 includes any number of lattice matched material pairs suitable for forming a superlattice structure 204. In some embodiments, the plurality of semiconductor material layers 226 and corresponding plurality of channel layers 224 comprise from about 2 to about 50 pairs of lattice matched materials. In some embodiments, the plurality of channel layers 224 may be doped with one or more of phosphorus (P), arsenic (As), boron (B), and gallium (Ga).

In one or more embodiments, the thickness of the plurality of semiconductor material layers 226 and the plurality of channel layers 224 are in a range of from about 2 nm to about 50 nm, including any subranges and values therebetween, such as in a range of from about 3 nm to about 20 nm, or in a range of from about 2 nm to about 15 nm.

FIG. 2A also illustrates a replacement gate structure (e.g., a dummy gate structure 209) that is formed and patterned over the superlattice structure 204. The dummy gate structure 209 defines the channel region of the transistor device. The dummy gate structure 209 may be formed using any suitable conventional deposition and patterning process known in the art. The dummy gate structure 209 may comprise any suitable material known to one of skill in the art. In some embodiments, the dummy gate structure 209 comprises one or more of a sacrificial oxide layer 210 and a dummy gate polysilicon layer 212. In some embodiments, sidewall spacers 214 are formed along outer sidewalls of the dummy gate structure 209. The sidewall spacers 214 of some embodiments comprise suitable insulating materials known in the art, for example, silicon nitride, silicon oxide, silicon oxynitride, silicon carbide, or the like. In some embodiments, the sidewall spacers 214 are formed using any suitable conventional deposition and patterning process known in the art, such as atomic layer deposition, plasma enhanced atomic layer deposition, plasma enhanced chemical vapor deposition or low-pressure chemical vapor deposition.

Figure 2B:
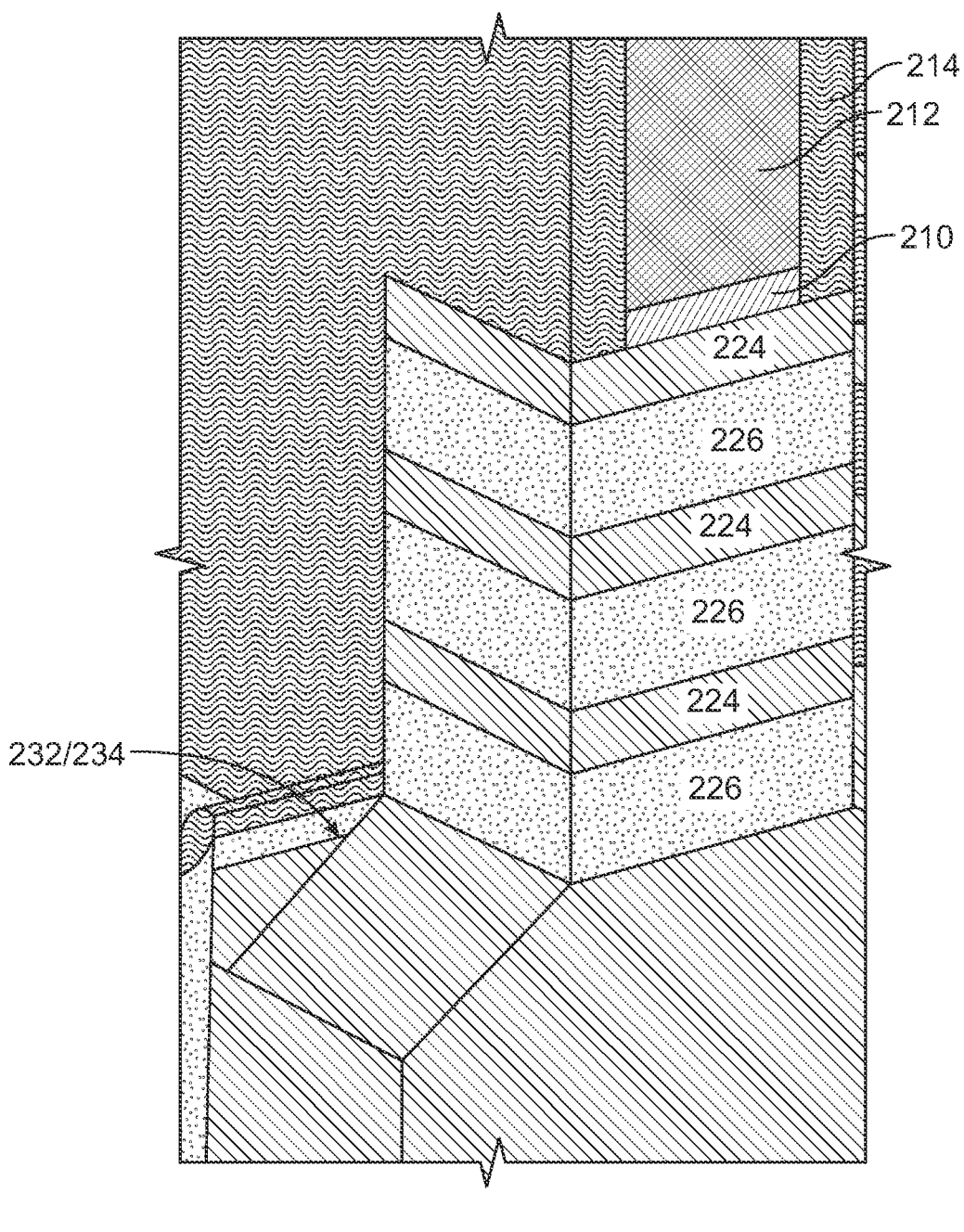
FIG. 2B illustrates a schematic cross-sectional view of an electronic device according to one or more embodiments.

Referring to FIG. 2B, at operation 104, in some embodiments, a source trench 232 and a drain trench 234 are formed on either side of, adjacent to, the superlattice structure 204. In some embodiments, the source trench 232 is formed adjacent a first end of the superlattice structure 204 and the drain trench 234 is formed adjacent a second, opposing end of the superlattice structure 204. In the embodiment illustrated in FIG. 2B, one of the source trench 232 or drain trench 234 is not shown at the front face of the superlattice structure 204. The other end of the superlattice structure 204 has the other of the source trench 232 or drain trench 234. In some embodiments, the source trench 232 and the drain trench 234 include a source region and a drain region formed respectively therein. Stated differently, in some embodiments, the source region is formed in the source trench 232 and the drain region is formed in the drain trench 234. In some embodiments, the source region and/or drain region are formed from any suitable semiconductor material, such as but not limited to silicon, germanium, silicon germanium, silicon phosphorous, silicon arsenic, or the like. In one or more embodiments, the source region and the drain region may independently be doped with one or more of phosphorus (P), arsenic (As), boron (B), and gallium (Ga). In some embodiments, the source region and drain region may be formed using any suitable deposition process, such as an epitaxial deposition process.

Figure 2C:
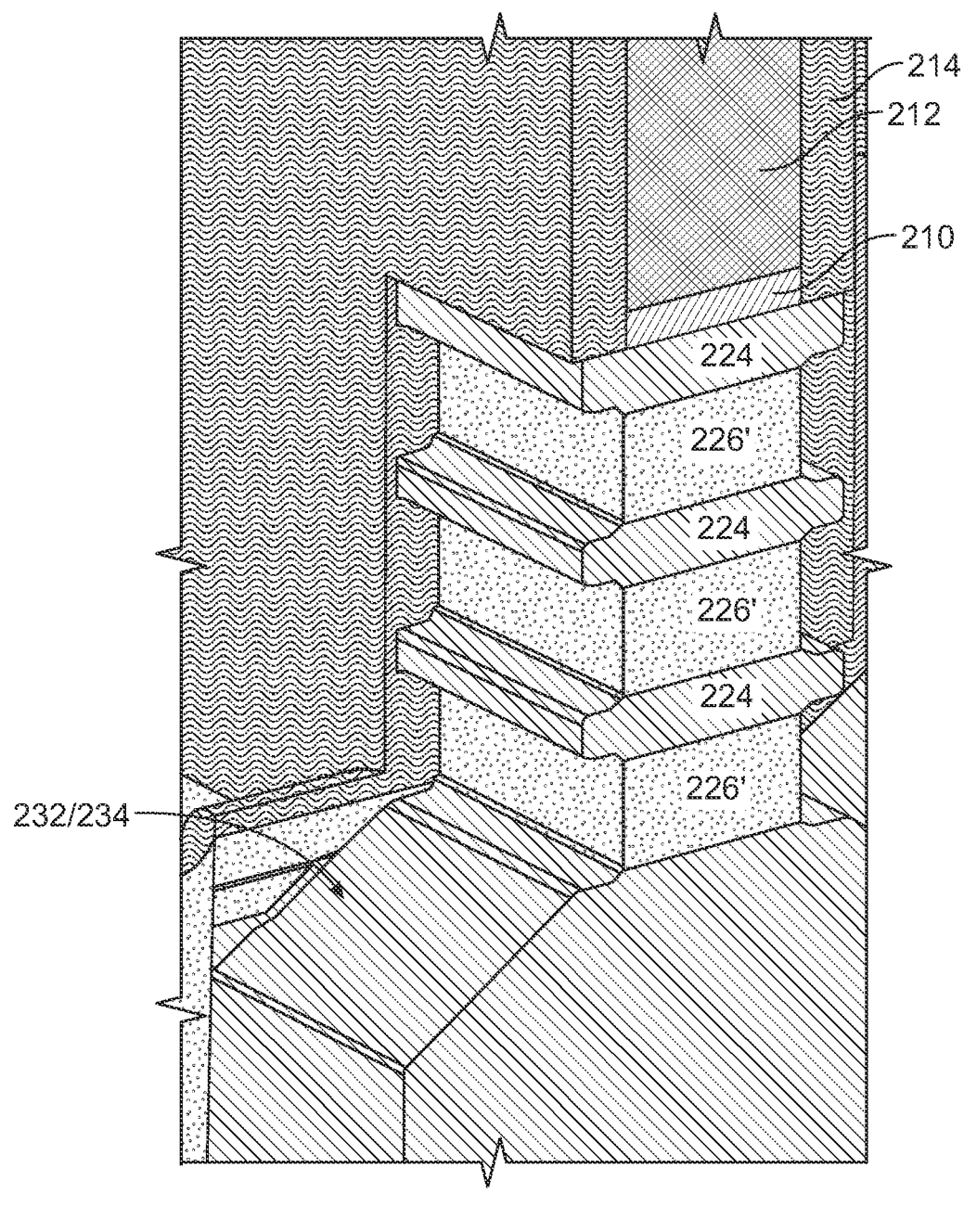
FIG. 2C illustrates a schematic cross-sectional view of an electronic device according to one or more embodiments.

Referring to FIG. 2C, at operation 106, a portion of the semiconductor material layers 226 are cavity etched isotropically to form recessed semiconductor material layers 226'. In one or more embodiments, an opening may be formed by isotropically etching under the superlattice structure 204. In some embodiments, the superlattice structure 204 comprises alternating layers of silicon (Si) (such as the plurality of channel layers 224) and silicon germanium (SiGe) (such as the plurality of semiconductor material layers 226), which are isotropically etched to form a cavity opening under the superlattice structure 204 by, for example, a dry etching process, a wet etching process, an RIE process, or combinations thereof. In some embodiments, the dry etching process includes using a fluorine-based etchant, such as HF, $CF_4$, $SF_6$, $CH_2F_2$, $CHF_3$, $C_2F_6$, other fluorine-containing etchants, or combinations thereof. In some embodiments, the wet etching process includes using an etchant including nitric acid ($HNO_3$), ammonium hydroxide ($NH_3OH$), ammonium fluoride ($NH_4F$), hydrogen peroxide ($H_2O_2$), other suitable etchants, or combinations thereof. In some embodiments, the etching process is controlled by factors such as duration, temperature, pressure, source power, bias voltage, bias power, etchant flow rate, and/or other suitable parameters to remove a desired amount of the semiconductor material layers 226. In some embodiments, an amount of the semiconductor material layers 226 removed at operation 106 is controlled by the duration of the etching process to ensure that sufficient channel length L is maintained for forming the metal gate stacks in subsequent processing steps.

In some embodiments, after the semiconductor material layer cavity etch at operation 106, a preclean process may be performed at operation 108 prior to inner spacer liner and inner spacer formation. The preclean process may include any suitable precleaning process known to the skilled artisan. In some embodiments, the preclean process includes etching a portion of the plurality of semiconductor material layers 226 with dilute hydrofluoric acid (dilute HF), including greater than 100:1, such as 130:1 dilute HF, to etch away native oxide on the substrate to form a hydrophobic surface. In some embodiments, the precleaning process may include a conventional plasma etch, or a remote plasma-assisted dry etch process, such as a SiCoNi™ etch process, commercially available from Applied Materials, Inc., located in Santa Clara, California. In a SiCoNi™ etch process, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The SiCoNi™ etch process may be performed in a SiCoNi™ Preclean chamber, which may be integrated into one of a variety of multi-processing platforms, include, for example, the Centura®, Dual ACP, Producer® GT, and Endura® platform, commercially available from Applied Materials®.

The wet etch process may include a hydrofluoric (HF) acid last process, i.e., the so-called "HF last" process, in which HF etching of surface is performed that leaves surface hydrogen-terminated. Alternatively, any other liquid-based pre-epitaxial preclean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

Figure 2D:
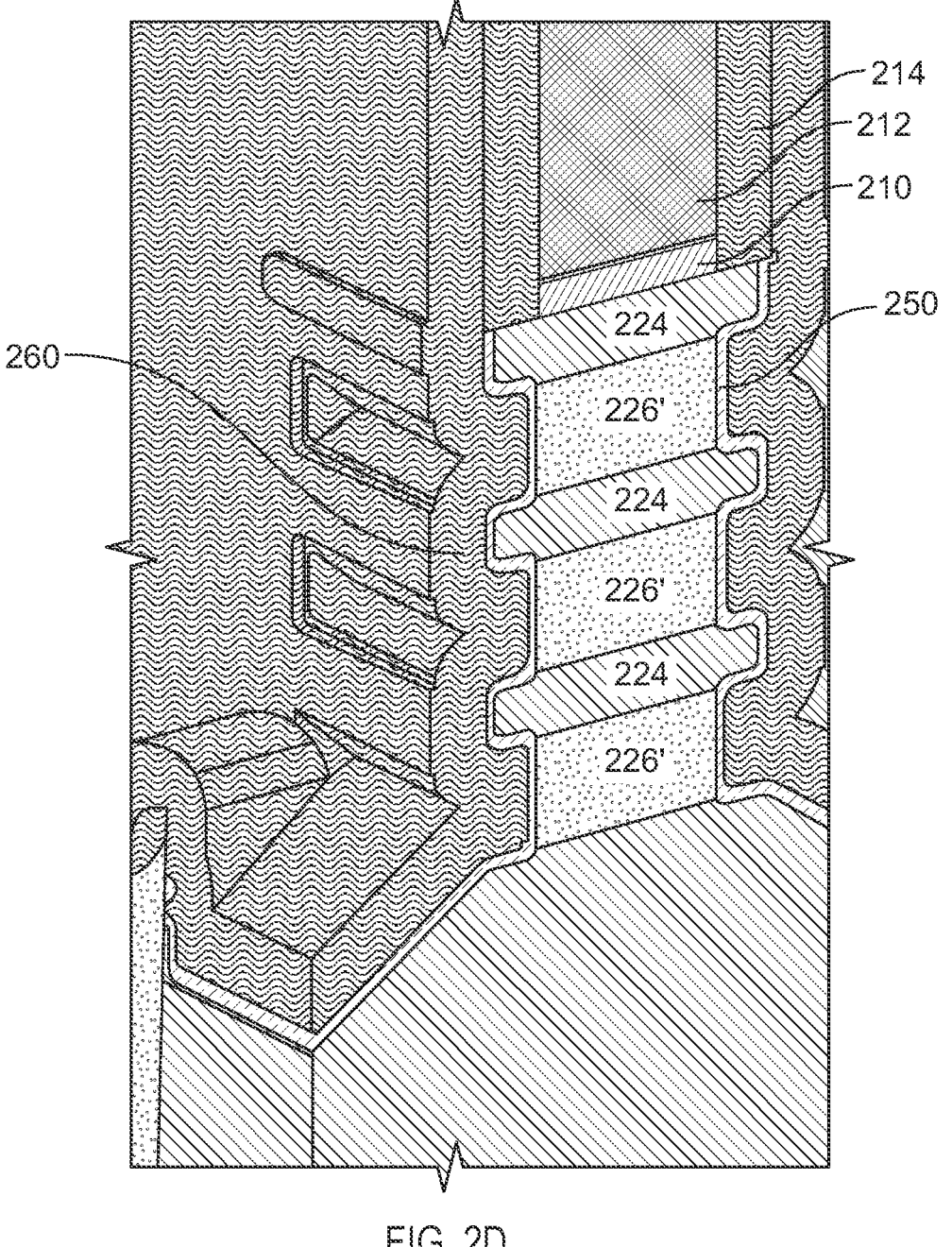
FIG. 2D illustrates a schematic cross-sectional view of an electronic device according to one or more embodiments.

In operation 110, as shown in FIG. 2D, the method 100 includes performing a chemical vapor deposition (CVD) process to form an amorphous silicon liner 250 and an inner spacer 260. In one or more embodiments, the CVD process is a thermal CVD process. The inner spacer liner 250 is particularly useful in nMOS FET structures, pMOS FET structures, and GAA devices, and will be described in that context, though the inner spacer liner 250 is not limited to these applications.

Embodiments of the present disclosure are directed to inner spacer liners that improve overall GAA device performance. Some embodiments are directed to forming an inner spacer liner prior to inner spacer formation to compensate for silicon (Si) corner loss during the indent/cavity etch. Some embodiments advantageously provide fully recovered ion/current loss by forming the inner spacer liner prior to inner spacer formation.

Embodiments of the present disclosure are directed to inner spacer liner configurations advantageously having overall lower effective capacitance ($C_{eff}$) while having high resistance to dry etch and wet etch processes. Some embodiments are directed to inner spacer liner configurations under 3 nm GAA device dimensions advantageously having overall lower effective capacitance ($C_{eff}$) compared to traditional inner spacers without an inner spacer liner in comparative GAA devices. It is thought that the presence of the inner spacer liner along the sidewall improves the wire-release process window, which will subsequently benefit for static random-access memory (SRAM) yield.

In some embodiments, the amorphous silicon liner 250 is formed prior to depositing the inner spacer 260, and the amorphous silicon liner 250 and the inner spacer 260 are formed by the same deposition process in a single step. As used herein, "amorphous silicon" or "a-Si" refers to a silicon-containing layer/film that is deposited without a crystal structure. In one or more embodiments, the amorphous silicon liner 250 and the inner spacer 260 are formed by flowing any suitable silicon precursors. During depositing the amorphous silicon liner 250, the flow of a second precursor source, such as a carbon source, an oxygen source, and/or a nitrogen source, is turned off. During depositing the inner spacer 260, the flow of a second precursor source, such as a carbon source, an oxygen source, and/or a nitrogen source, is turned on to form an inner spacer comprising a low-κ dielectric material, such as one or more of silicon oxycarbide (SiOC) or silicon oxynitride (SiON). In one or more embodiments, the chemical vapor deposition (CVD) process is performed at a temperature in a range of from 400° C. to 650° C. In one or more embodiments, the amorphous silicon liner 250 and the inner spacer 260 are formed at different temperatures in the range of from 400° C. to 650° C.

In some embodiments, the amorphous silicon liner 250 is formed along the GAA device, including along the recessed semiconductor material layers 226' and the corresponding plurality of channel layers 224. In some embodiments, the inner spacer 260 is formed directly on the amorphous silicon liner 250. In some embodiments, the amorphous silicon liner 250 is conformally formed along the recessed semiconductor material layers 226' and the corresponding plurality of channel layers 224 and along the sidewall spacer 214. In some embodiments, the inner spacer 260 is adjacent the source trench 232 and the drain trench 234.

The thermal chemical vapor deposition process of operation 108 may be performed until the amorphous silicon liner 250 and the inner spacer 260 are formed to a desired thickness. In some embodiments, the amorphous silicon liner 250 has a thickness in a range of from 0.5 nm to 3 nm, including all subranges and values therebetween. In some embodiments, the thickness of the amorphous silicon liner 250 varies depending on the amount of silicon (Si) loss, described further below.

The inner spacer 260 may comprise any suitable insulating materials known in the art, for example, a low-κ dielectric material. In one or more embodiments, the low-κ dielectric material has a κ-value in a range of from 3 to 5. In some embodiments, the low-κ dielectric material of the inner spacer 260 comprises one or more of silicon (Si), silicon oxide (SiOx), doped silicon, doped silicon oxide, or spin-on dielectrics. In some embodiments, the low-κ dielectric material of the inner spacer 260 comprises one or more of silicon oxycarbide (SiOC) or silicon oxynitride (SiON). In some embodiments, the inner spacer 260 has a thickness in a range of from 2 nm to 5 nm, including all subranges and values therebetween.

In some embodiments, the amorphous silicon liner 250 has a thickness in a range of from 0.5 nm to 3 nm and the inner spacer 260 has a thickness in a range of from 2 nm to 5 nm, including all subranges and values therebetween. In some embodiments, the amorphous silicon liner 250 and the inner spacer 260 are formed in situ in an integrated processing tool. In some embodiments, the amorphous silicon liner 250 is formed prior to depositing the inner spacer 260, and the amorphous silicon liner 250 and the inner spacer 260 are formed by the same deposition process (e.g., the CVD process of operation 110 of method 100) in a single step.

In some embodiments, the amorphous silicon liner 250 is conformally formed along the recessed semiconductor material layers 226' and the corresponding plurality of channel layers 224 and along the sidewall spacer 214. As used herein, the term "conformal" means that the layer adapts to the contours of a feature or a layer. Conformality of a layer is typically quantified by a ratio of the average thickness of a layer deposited on the sidewalls of a feature to the average thickness of the same deposited layer on the field, or upper surface, of the substrate. In some embodiments, one or more of the amorphous silicon liner 250 and the inner spacer 260 have a conformality in a range of from 70% to 90%. As used in this regard, "conformality in a range of from 70% to 90%" means that the ratio of the average thickness of the stated layer(s) deposited on the sidewalls of a feature to the average thickness of the same deposited layer on the field, or upper surface, of the substrate is in a range of 70% to 90%.

The amorphous silicon liner 250 and the inner spacer 260 may define any suitable shape, including, but not limited to, round, square, rectangular, or any other polygonal shape.

In some embodiments, each of the amorphous silicon liner 250 and the inner spacer 260 are substantially free of seams and/or voids. As used in this regard, "substantially free" means that less than about 5%, including less than about 4%, less than about 3%, less than about 2%, less than about 1%, less than about 0.5%, and less than about 0.1% of the total composition of each of the amorphous silicon liner 250 and the inner spacer 260 on an atomic basis, comprises seams and/or voids.

Figure 2E:
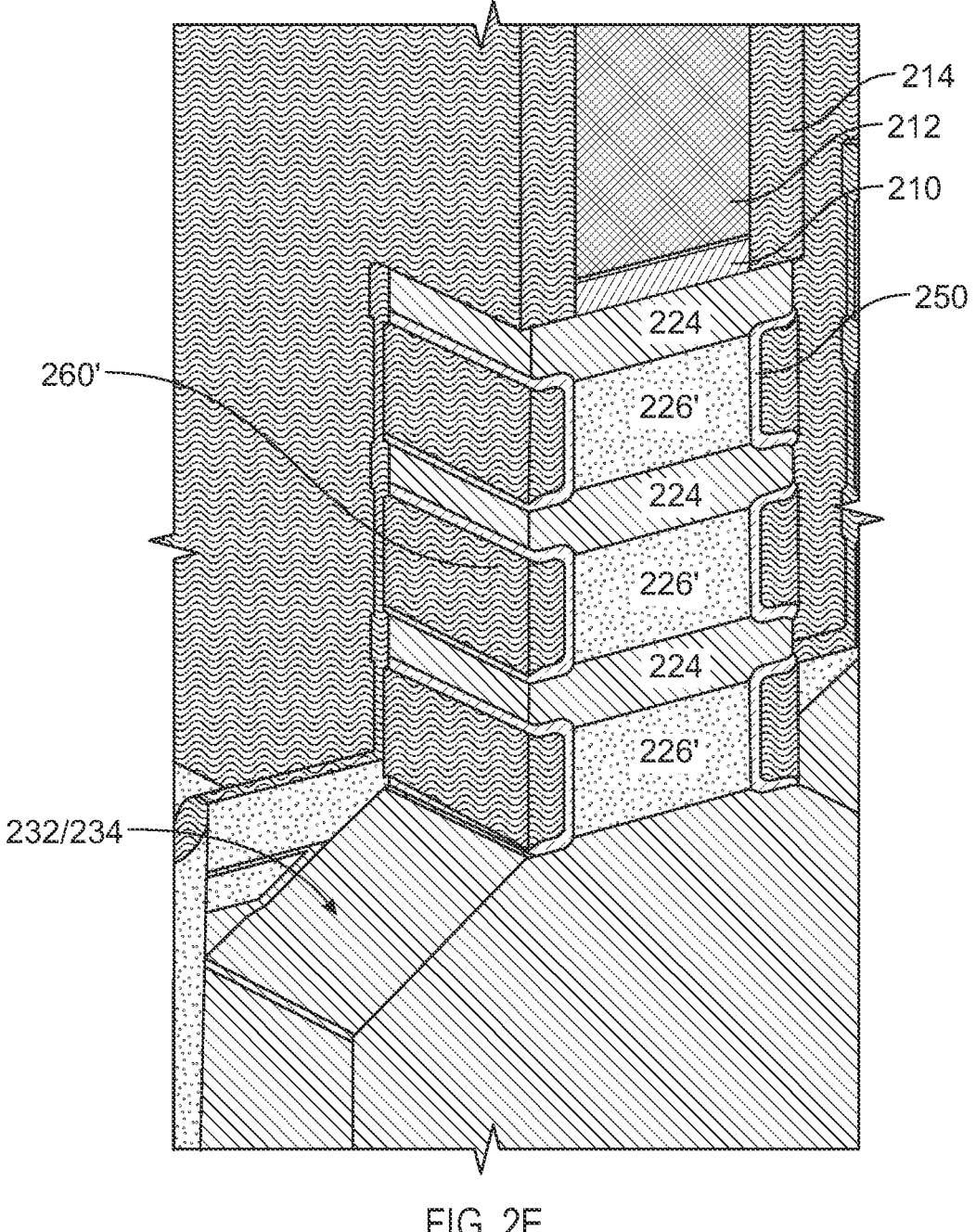
FIG. 2E illustrates a schematic cross-sectional view of an electronic device according to one or more embodiments.

Referring to FIG. 2E, in operation 112, the method 100 includes etching a portion of the inner spacer 260 to form etched inner spacer 260'. The etch process of operation 112 may include any suitable etch processes, including, but not limited to, the preclean process, the wet etch process, or the dry etch process described herein. In one or more embodiments, the inner spacer 260 to form etched inner spacer 260' and the amorphous silicon liner is etched from the sidewall spacers 214.

Figure 2F:
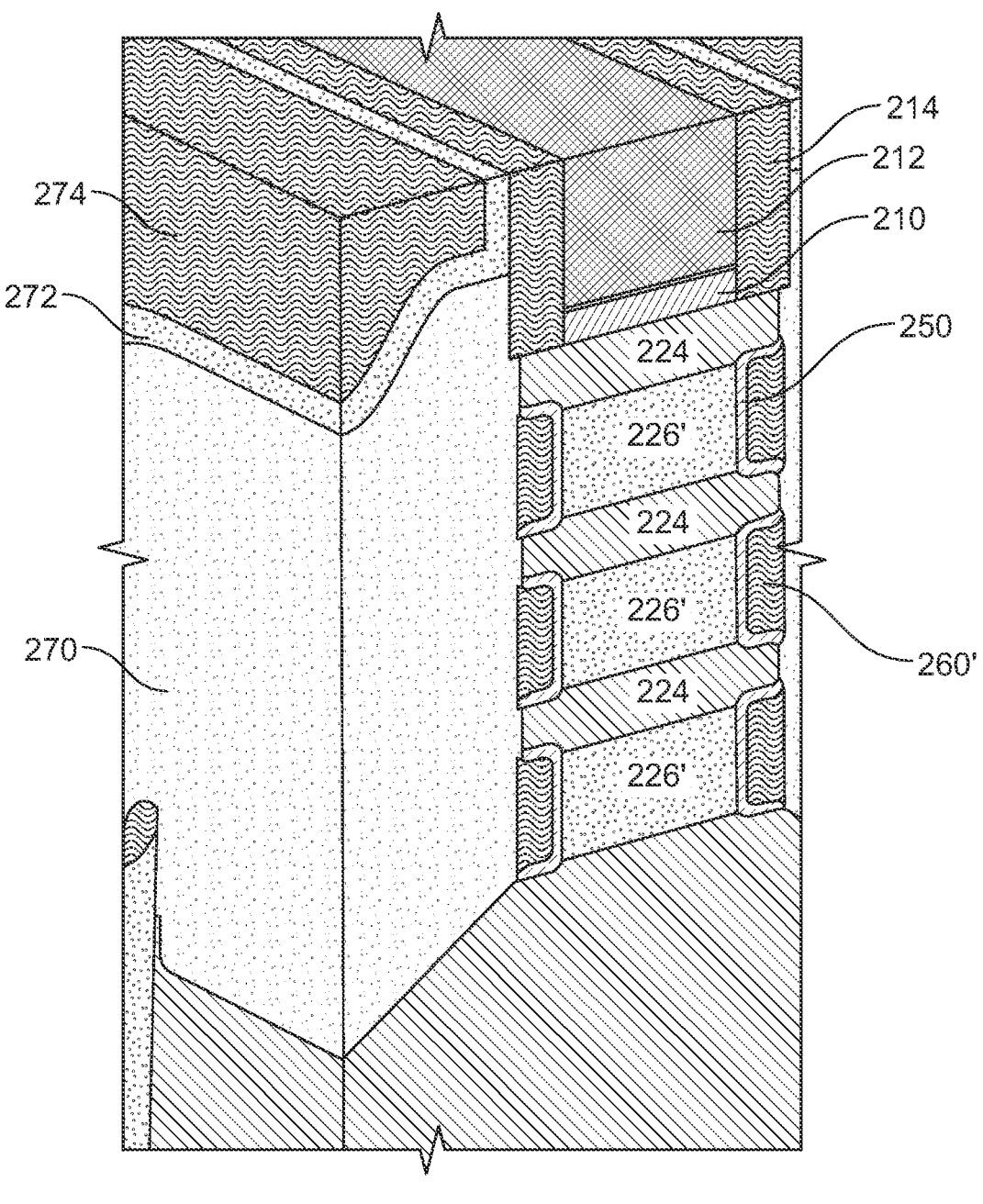
FIG. 2F illustrates a schematic cross-sectional view of an electronic device according to one or more embodiments.

Referring to FIG. 2F, the method 100 includes a source/drain epitaxial growth and interlayer dielectric formation process (operation 114) and replacement metal gate formation and polysilicon removal (operation 116). In FIG. 2F, the GAA device includes a highly doped epitaxy source/drain junction 270, a protective dielectric layer 272 on the highly doped epitaxy source/drain junction 270, such as silicon nitride (SiN), silicon oxynitride (SiON), or combinations thereof, and an interlayer dielectric 274 formed on the protective dielectric layer 272. Such processes and layers shown in FIG. 2F are known by the skilled artisan.

In some embodiments, at operation 116, the dummy gate structure 209 is removed to expose the channel region of the superlattice structure 204. The layers 270, 272, and 274 protect the source/drain trenches 232/234 during the removal of the dummy gate structure 209. The dummy gate structure 209 may be removed using any conventional etching process, such as the preclean process, the wet etch process, or the dry etch process described herein. In some embodiments, the dummy gate structure 209 comprises one or more of a sacrificial oxide layer 210 and a dummy gate polysilicon layer 212, and the entire dummy gate structure 209 is removed by a selective etch process. In embodiments, where the dummy gate structure 209 includes a sidewall spacer, such as sidewall spacer 214, the sidewall spacer(s) 214 is not removed at operation 112.

Figure 2G:
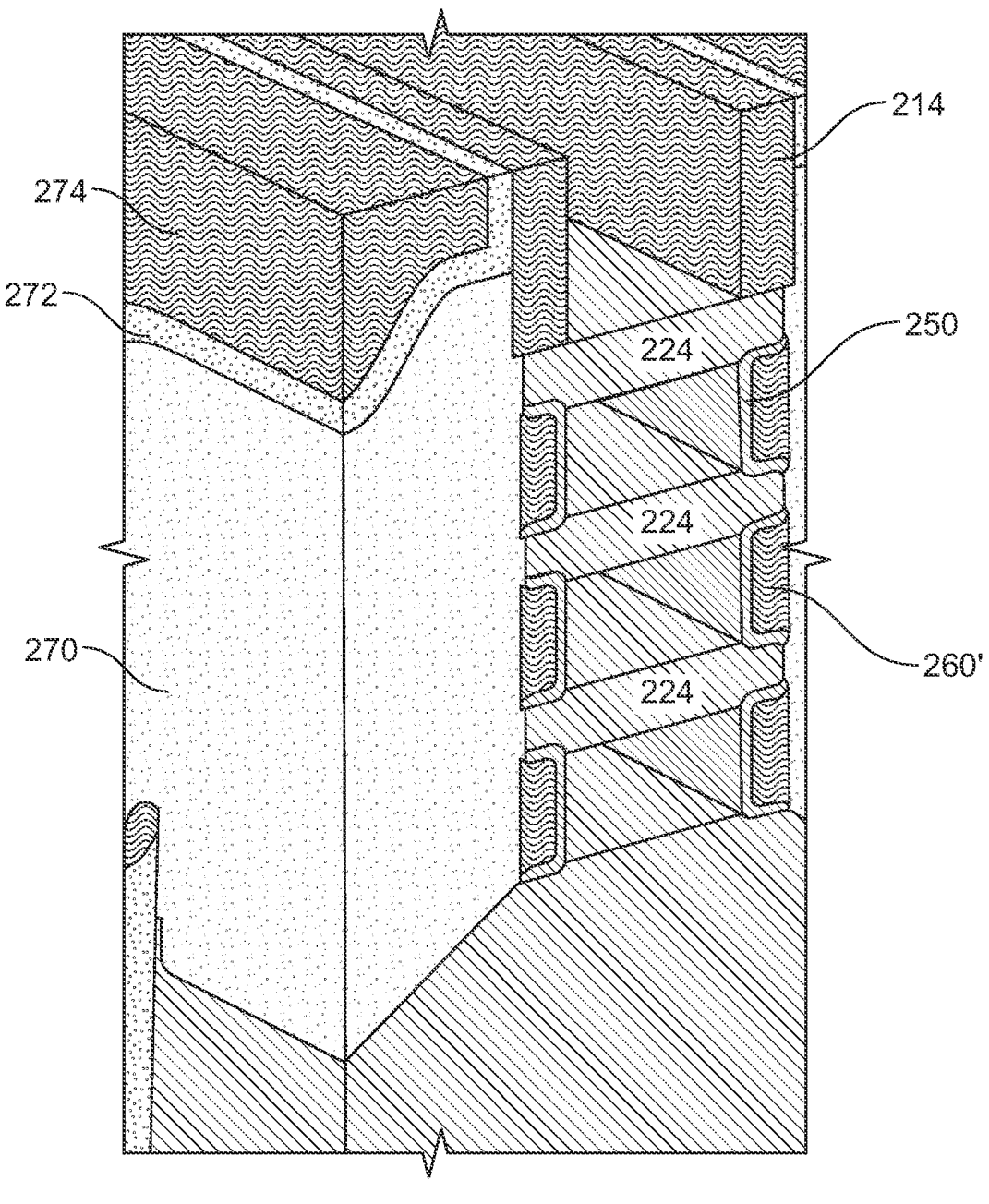
FIG. 2G illustrates a schematic cross-sectional view of an electronic device according to one or more embodiments.

Referring to FIG. 2G, at operation 118, the method 100 includes removing the recessed semiconductor material layers 226' in the superlattice structure 204. At operation 118, the recessed semiconductor material layers 226' are selectively etched between the plurality of channel layers 224 in the superlattice structure 204. For example, where the superlattice structure 204 is composed of silicon (Si) layers and silicon germanium (SiGe) layers, the silicon germanium (SiGe) is selectively etched to form channel nanowires. The recessed semiconductor material layers 226', comprising silicon germanium (SiGe), for example, may be removed using any well-known etchant that is selective to the plurality of channel layers 224, for example silicon (Si), where the etchant etches the recessed semiconductor material layers 226' at a significantly higher rate than the plurality of channel layers 224. In some embodiments, the preclean process, the selective dry etch process, or the wet etch process, as described herein, may be used. In some embodiments, where the plurality of channel layers 224 are silicon (Si) and the recessed semiconductor material layers 226' are silicon germanium (SiGe), the layers of silicon germanium may be selectively removed using a wet etchant such as, but not limited to aqueous carboxylic acid/nitric acid/HF solution and aqueous citric acid/nitric acid/HF solution.

In one or more embodiments, as illustrated in FIG. 2G, the removal of the plurality of semiconductor material layers 226 (and/or the recessed semiconductor material layers 226') leaves voids between the plurality of channel layers 224. The voids between the plurality of channel layers 224 have a thickness of about 3 nm to about 20 nm, including any subranges and values therebetween. The remaining channel layers 224 form a vertical array of channel nanowires that are coupled to the source/drain regions in the source/drain trenches 232/234. The channel nanowires run parallel to the top surface 202 of the substrate 200 and are aligned with each other to form a single column of channel nanowires.

Figure 2H:
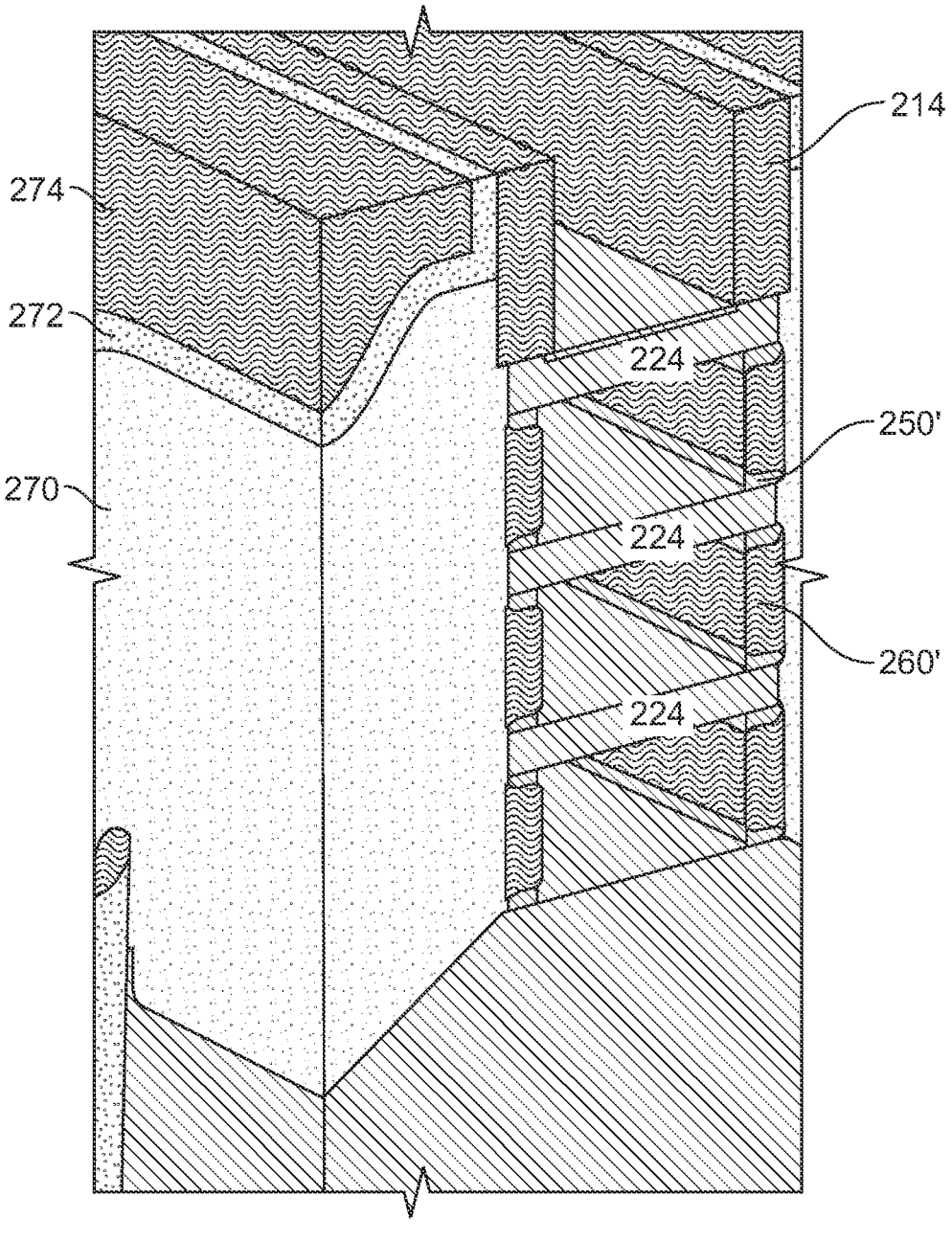
FIG. 2H illustrates a schematic cross-sectional view of an electronic device according to one or more embodiments.

Referring to FIG. 2H, at operation 120, the method 100 includes etching a portion of the amorphous silicon liner 250 to form etched amorphous silicon liner 250'. In one or more embodiments, the portion of the amorphous silicon liner 250 that is etched at operation 120 is the portion that was previously formed along the recessed semiconductor material layers 226', the recessed semiconductor material layers 226' removed at operation 118 shown in FIG. 2G. In one or more embodiments, the portion of the amorphous silicon liner 250 that was formed along the recessed semiconductor material layers 226' (which were removed at operation 118 shown in FIG. 2G) may be referred to as an inner sidewall or an inner sidewall portion. The portion of the amorphous silicon liner 250 that is formed along the plurality of channel layers 224 is not etched.

It has been advantageously found that etching the portion of the amorphous silicon liner 250 that is formed along the inner sidewall at operation 120 to form etched amorphous silicon liner 250' reduces the effective capacitance ($C_{eff}$) of the GAA device as measured by femtofarads per micrometer (fF/μm) compared to a GAA device that does not have an inner spacer liner.

For example, in some embodiments, the amorphous silicon liner 250 has a thickness of about 1 nm and the inner spacer 260 comprises a low-κ dielectric material having a κ-value of 4 when there is about 1 nm of silicon (Si) loss. In specific embodiments where the amorphous silicon liner 250 has a thickness of about 1 nm and the inner spacer 260 comprises a low-κ dielectric material having a κ-value of 4 when there is about 1 nm of silicon (Si) loss, and the portion of the amorphous silicon liner 250 that is formed along the inner sidewall is etched at operation 116 to form etched amorphous silicon liner 250', the GAA device has reduced effective capacitance ($C_{eff}$) measured by femtofarads per micrometer (fF/μm) compared to a GAA device that does not have an inner spacer liner.

In other embodiments, the amorphous silicon liner 250 has a thickness of about 2 nm and the inner spacer 260 comprises a low-κ dielectric material having a κ-value of 4 when there is about 1 nm of silicon (Si) loss. In specific embodiments where the amorphous silicon liner 250 has a thickness of about 2 nm and the inner spacer 260 comprises a low-κ dielectric material having a κ-value of 4 when there is about 1 nm of silicon (Si) loss, and the portion of the amorphous silicon liner 250 that is formed along the inner sidewall is etched at operation 116 to form etched amorphous silicon liner 250', the GAA device has DC performance gain compared to a GAA device that does not have an inner spacer liner.

It has been advantageously found that a GAA device having the etched amorphous silicon liner 250' compared to a GAA device that does not have an inner spacer liner, at the same effective capacitance ($C_{eff}$) as measured by femtofarads per micrometer (fF/μm), results in about a 40% increase in DC performance in the GAA device having the amorphous silicon liner 250.

In some embodiments, the amorphous silicon liner 250 has a thickness in a range of from 0.5 nm to 3 nm, including all subranges and values therebetween. It has been discovered that an amorphous silicon liner having a thickness greater than 3 nm has overall greater effective capacitance ($C_{eff}$) compared to the amorphous silicon liner 250 described herein.

Figure 2I:
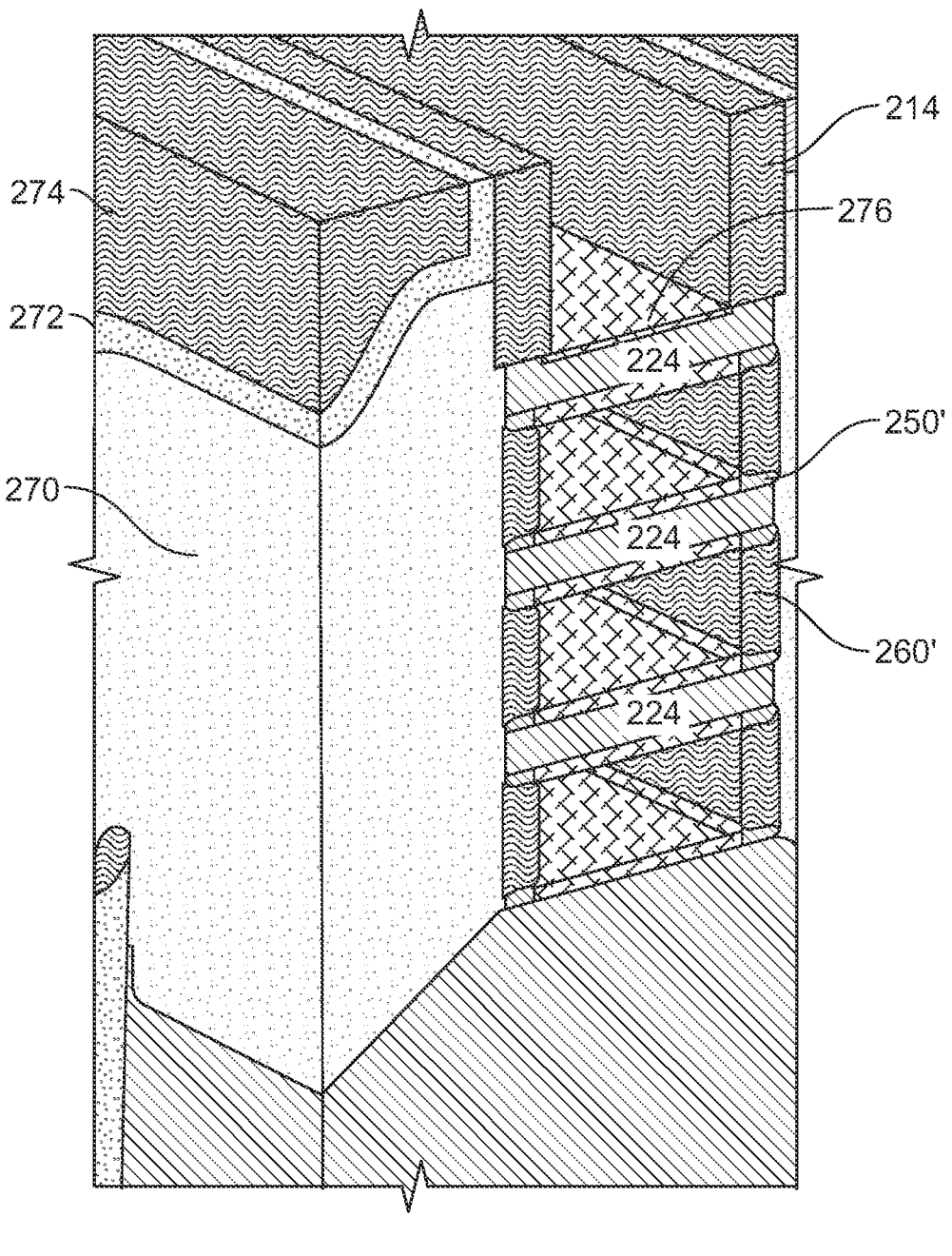
FIG. 2I illustrates a schematic cross-sectional view of an electronic device according to one or more embodiments.

Referring to FIG. 2I, at operation 122, the method 100 includes forming an interlayer dielectric (ILD) 276 on each of the remaining channel layers 224. In some embodiments, the ILD 276 encapsulates the remaining channel layers 224, and covers all portions of the channel layers 224 except for the etched amorphous silicon liner 250' covered portion. The ILD 276 may be deposited using a conventional chemical vapor deposition method (e.g., plasma enhance chemical vapor deposition and low-pressure chemical vapor deposition). In one or more embodiments, ILD 276 is formed from any suitable dielectric material described herein, such as, but not limited to, undoped silicon oxide, doped silicon oxide (e.g., BPSG, PSG), silicon nitride, and silicon oxynitride.

Figure 2J:
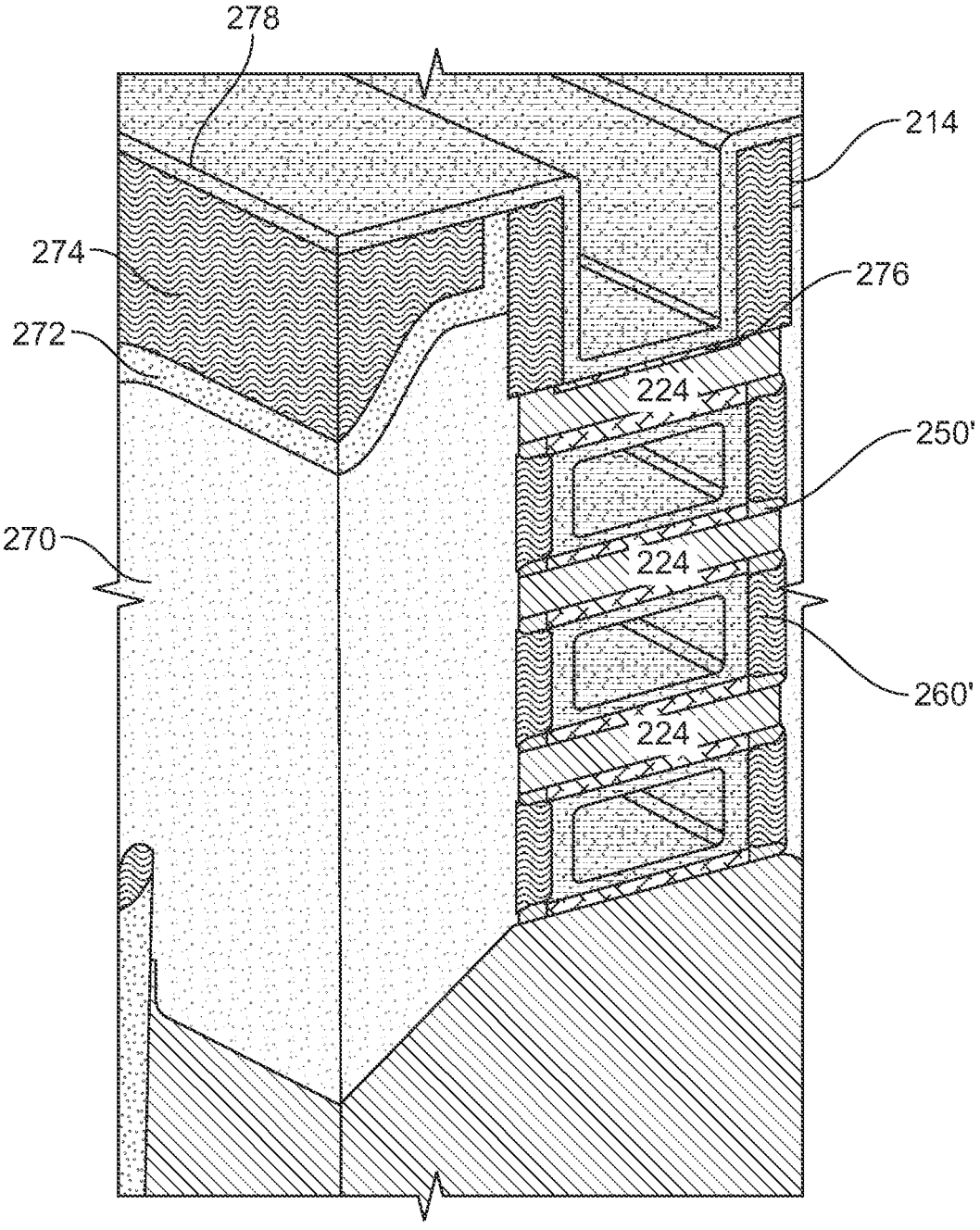
FIG. 2J illustrates a schematic cross-sectional view of an electronic device according to one or more embodiments.

Referring to FIG. 2J, at operation 124, the method 100 includes one or more processes known to the skilled artisan for completion of the hGAA device, e.g., replacement metal gate formation. For example, in one or more embodiments, a high-k dielectric 278 is formed on the ILD 276. The high-k dielectric 278 can be any suitable high-k dielectric material deposited by any suitable deposition technique known to the skilled artisan. The high-k dielectric 278 of some embodiments comprises hafnium oxide. In some embodiments, a conductive material such as titanium nitride (Tin), tungsten (W), cobalt (Co), aluminum (Al), or the like is deposited on the high-k dielectric. The conductive material may be formed using any suitable deposition process such as, but not limited to, atomic layer deposition (ALD) in order to ensure the formation of a layer having a uniform thickness around each of the plurality of channel layers 224.

Figure 3:
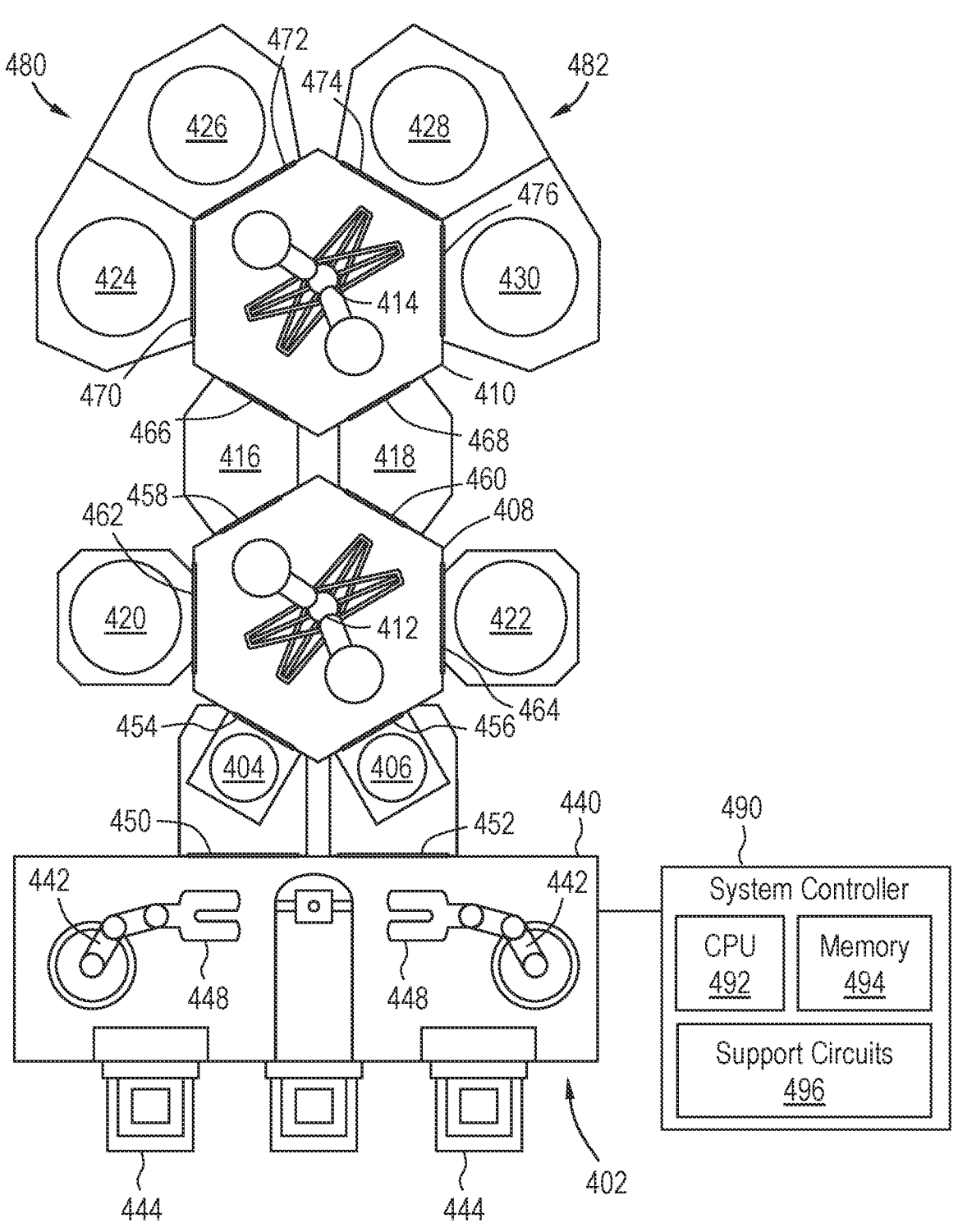
FIG. 3 illustrates a schematic top-view diagram of an example multi-chamber processing system for forming an electronic device according to one or more embodiments.

Additional embodiments of the disclosure are directed to processing systems 400 for the formation of the amorphous silicon liner 250 and inner spacer 260 for the electronic devices (e.g., GAA devices) and methods described, as shown in FIG. 3. Examples of a processing system that may be suitably modified in accordance with the teachings provided herein, include the Centura®, Dual ACP, Producer® GT, and Endura® platform, commercially available from Applied Materials® in Santa Clara, California, as well as other processing systems may be utilized. It is contemplated that other processing systems (including those from other manufacturers) may be adapted to benefit from aspects described herein.

The processing system 400 may include any dielectric deposition product (DDP) that is commercially available from Applied Materials® in Santa Clara, California. In some embodiments, the processing system 400 includes a low-κ silicon oxycarbide (SiOC) dielectric chemical vapor deposition (CVD) chamber. In some embodiments, the processing system 400 includes advanced unit process solutions through combining the low-κ silicon oxycarbide (SiOC) dielectric chemical vapor deposition (CVD) chamber with Sym3® Etch System, commercially available from Applied Materials® in Santa Clara, California, providing an integrated tool solution (e.g., an integrated cyclic-CVD deposition-and-etch processing system).

In some embodiments, one or more of the operations of the methods of this disclosure is performed in situ, as described herein. In some embodiments, one or more of the operations of the methods of this disclosure is performed ex situ, as described herein. In some embodiments, one or more operations of method 100 are performed in situ in an integrated processing tool, e.g., processing system 400. As used herein, the terms "integrated processing tool", "integrated tool system", "cluster tool", "processing tool", and "processing system 400" may be used interchangeably to refer to the processing system 400 shown in FIG. 3 unless otherwise indicated.

One or more operations of method 100 are performed in situ in an integrated processing tool system, e.g., processing system 400 by an integrated module. The integrated modules described herein are performed in situ in an integrated processing tool system, e.g., processing system 400, unless stated otherwise.

In some embodiments, the processing system 400 includes an integrated module for performing a preclean process (operation 108 of method 100) prior to inner spacer liner and inner spacer formation, and performing the thermal chemical vapor deposition process to form the amorphous silicon liner and the inner spacer within the superlattice structure (operation 110 of method 100).

In some embodiments, the processing system 400 includes an integrated module for performing a preclean process (operation 108 of method 100) prior to inner spacer liner and inner spacer formation, performing the thermal chemical vapor deposition process to form the amorphous silicon liner and the inner spacer within the superlattice structure (operation 110 of method 100), and etching a portion of the inner spacer (operation 112 of method 100).

In some embodiments, the processing system 400 is also particularly useful in 3D memory horizontal wordline applications and for forming contact/sidewall spacers.

In some embodiments, the operations of the methods described herein are each performed within the same processing chamber. In some embodiments, the operations of the methods described herein are each performed within a different processing chamber. In some embodiments, the different processing chambers are connected as part of a processing system. In some embodiments, the operations of the methods described herein are performed without an intervening vacuum break.

FIG. 3 illustrates a schematic top-view diagram of an example of a multi-chamber processing system 400 according to embodiments of the present disclosure. The processing system 400 generally includes a factory interface 402, load lock chambers 404, 406, transfer chambers 408, 410 with respective transfer robots 412, 414, holding chambers 416, 418, and processing chambers 420, 422, 424, 426, 428, 430. As detailed herein, wafers in the processing system 400 can be processed in and transferred between the various chambers without exposing the wafers to an ambient environment exterior to the processing system 400 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 400. Accordingly, the processing system 400 may provide for an integrated solution for some processing of wafers.

In the illustrated example of FIG. 3, the factory interface 402 includes a docking station 440 and factory interface robots 442 to facilitate transfer of wafers. The docking station 440 is configured to accept one or more front opening unified pods (FOUPs) 444. In some examples, each factory interface robot 442 generally comprises a blade 448 disposed on one end of the respective factory interface robot 442 configured to transfer the wafers from the factory interface 402 to the load lock chambers 404, 406.

The load lock chambers 404, 406 have respective ports 450, 452 coupled to the factory interface 402 and respective ports 454, 456 coupled to the transfer chamber 408. The transfer chamber 408 further has respective ports 458, 460 coupled to the holding chambers 416, 418 and respective ports 462, 464 coupled to processing chambers 420, 422. Similarly, the transfer chamber 410 has respective ports 466, 468 coupled to the holding chambers 416, 418 and respective ports 470, 472, 474, 476 coupled to processing chambers 424, 426, 428, 430. The ports 454, 456, 458, 460, 462, 464, 466, 468, 470, 472, 474, 476 can be, for example, slit valve openings with slit valves for passing wafers therethrough by the transfer robots 412, 414 and for providing a seal between respective chambers to prevent a gas from passing between the respective chambers. Generally, any port is open for transferring a wafer therethrough. Otherwise, the port is closed.

The load lock chambers 404, 406, transfer chambers 408, 410, holding chambers 416, 418, and processing chambers 420, 422, 424, 426, 428, 430 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 442 transfers a wafer from a FOUP 444 through a port 450 or 452 to a load lock chamber 404 or 406. The gas and pressure control system then pumps down the load lock chamber 404 or 406. The gas and pressure control system further maintains the transfer chambers 408, 410 and holding chambers 416, 418 with an interior low pressure or vacuum environment (which may include an inert gas). Hence, the pumping down of the load lock chamber 404 or 406 facilitates passing the wafer between, for example, the atmospheric environment of the factory interface 402 and the low pressure or vacuum environment of the transfer chamber 408.

With the wafer in the load lock chamber 404 or 406 that has been pumped down, the transfer robot 412 transfers the wafer from the load lock chamber 404 or 406 into the transfer chamber 408 through the port 454 or 456. The transfer robot 412 is then capable of transferring the wafer to and/or between any of the processing chambers 420, 422 through the respective ports 462, 464 for processing and the holding chambers 416, 418 through the respective ports 458, 460 for holding to await further transfer. Similarly, the transfer robot 414 is capable of accessing the wafer in the holding chamber 416 or 418 through the port 466 or 468 and is capable of transferring the wafer to and/or between any of the processing chambers 424, 426, 428, 430 through the respective ports 470, 472, 474, 476 for processing and the holding chambers 416, 418 through the respective ports 466, 468 for holding to await further transfer. The transfer and holding of the wafer within and among the various chambers can be in the low pressure or vacuum environment provided by the gas and pressure control system.

The processing chambers 420, 422, 424, 426, 428, 430 can be any appropriate chamber for processing a wafer. In some embodiments, the processing chambers 420, 422, 424, 426, 428, 430 include a preclean chamber, a chemical vapor deposition (CVD) chamber, and an etch chamber. In some embodiments, the processing chamber 420 can be capable of performing an annealing process, the processing chamber 422 can be capable of performing a cleaning process, and the processing chambers 424, 426, 428, 430 can be capable of performing epitaxial growth processes. In some examples, the processing chamber 422 can be capable of performing a cleaning process, the processing chamber 420 can be capable of performing an etch process, and the processing chambers 424, 426, 428, 430 can be capable of performing respective epitaxial growth processes. The processing chamber 422 may be a SiCoNi™ Preclean chamber available from Applied Materials of Santa Clara, Calif. The processing chamber 420 may be a Selectra™ Etch chamber available from Applied Materials of Santa Clara, Calif.

A system controller 490 is coupled to the processing system 400 for controlling the processing system 400 or components thereof. For example, the system controller 490 may control the operation of the processing system 400 using a direct control of the chambers 404, 406, 408, 416, 418, 410, 420, 422, 424, 426, 428, 430 of the processing system 400 or by controlling controllers associated with the chambers 404, 406, 408, 416, 418, 410, 420, 422, 424, 426, 428, 430. In operation, the system controller 490 enables data collection and feedback from the respective chambers to coordinate performance of the processing system 400.

The system controller 490 generally includes a central processing unit (CPU) 492, memory 494, and support circuits 496. The CPU 492 may be one of any form of a general-purpose processor that can be used in an industrial setting. The memory 494, or non-transitory computer-readable medium, is accessible by the CPU 492 and may be one or more of memory such as random-access memory (RAM), read only memory (ROM), floppy disk, hard disk, or any other form of digital storage, local or remote. The support circuits 496 are coupled to the CPU 492 and may comprise cache, clock circuits, input/output subsystems, power supplies, and the like. The various methods disclosed herein may generally be implemented under the control of the CPU 492 by the CPU 492 executing computer instruction code stored in the memory 494 (or in memory of a particular process chamber) as, for example, a software routine. When the computer instruction code is executed by the CPU 492, the CPU 492 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 408, 410 and the holding chambers 416, 418. In other examples, more or fewer transfer chambers (e.g., one transfer chamber) and/or more or fewer holding chambers (e.g., no holding chambers) may be implemented as a transfer apparatus in a processing system.

Processes may generally be stored in the memory of the system controller 490 as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

One or more embodiments of the disclosure are directed to a non-transitory computer readable medium including instructions, that, when executed by a controller of a processing chamber, cause the processing chamber to perform the methods described herein, such as method 100.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of manufacturing an electronic device, the method comprising:
    forming a superlattice structure on a top surface of a semiconductor substrate, the superlattice structure comprising a plurality of semiconductor material layers and a corresponding plurality of channel layers alternatingly arranged in a plurality of stacked pairs;
    recessing a portion of each semiconductor material layer of the plurality of semiconductor material layers to form a plurality of recessed semiconductor material layers;
    forming an amorphous silicon liner conformally along the plurality of recessed semiconductor material layers and the corresponding plurality of channel layers; and
    forming a dielectric inner spacer directly on the amorphous silicon liner, wherein the dielectric inner spacer is adjacent a source region and a drain region, wherein the amorphous silicon liner and the dielectric inner spacer are formed by a same deposition process in a single step.

2. The method of claim 1, further comprising precleaning the semiconductor substrate prior to the forming the amorphous silicon liner and the forming the dielectric inner spacer.

3. The method of claim 2, wherein the precleaning the semiconductor substrate, the forming the amorphous silicon liner, and the forming the inner spacer are performed in an integrated tool system without vacuum break.

4. The method of claim 1, wherein the amorphous silicon liner has a thickness in a range of from 0.5 nm to 3 nm.

5. The method of claim 1, the amorphous silicon liner and the dielectric inner spacer are formed by a chemical vapor deposition (CVD) process at a temperature in a range of from 400° C. to 650° C.

6. The method of claim 1, wherein the dielectric inner spacer comprises a low-K dielectric material.

7. The method of claim 6, wherein the low-κ dielectric material has a κ-value of in a range of from 3 to 5.

8. The method of claim 6, wherein the low-κ dielectric material comprises one or more of silicon oxycarbide (SiOC) or silicon oxynitride (SiON).

9. The method of claim 1, wherein each of the amorphous silicon liner and the dielectric inner spacer are substantially free of seams and/or voids.

10. The method of claim 1, wherein the plurality of semiconductor material layers comprises silicon germanium (SiGe) and the corresponding plurality of channel layers comprises silicon (Si).

11. The method of claim 1, further comprising etching a portion of the dielectric inner spacer.

12. A method of manufacturing a gate-all-around (GAA) device, the method comprising:
    precleaning a semiconductor substrate, the semiconductor substrate having a superlattice structure and a replacement metal gate formed on a top surface of the substrate, the superlattice structure comprising a plurality of recessed semiconductor material layers and a corresponding plurality of channel layers alternatingly arranged in a plurality of stacked pairs;
    performing a single step chemical vapor deposition (CVD) process to form an amorphous silicon liner and a dielectric inner spacer within the superlattice structure, the amorphous silicon liner conformally formed along the plurality of recessed semiconductor material layers and the corresponding plurality of channel layers, the dielectric inner spacer formed directly on the amorphous silicon liner, the dielectric inner spacer adjacent a source region and a drain region;
    etching an outer portion of the inner spacer; and
    removing the replacement metal gate and the plurality of recessed semiconductor material layers from the semiconductor substrate, followed by etching an inner sidewall portion of the amorphous silicon liner.

13. The method of claim 12, further comprising forming an interlayer dielectric (ILD) on the plurality of channel layers after the etching the inner sidewall portion of the amorphous silicon liner.

14. The method of claim 13, wherein the precleaning the semiconductor substrate and the performing the single step chemical vapor deposition (CVD) process to form the amorphous silicon liner and the dielectric inner spacer within the superlattice structure are performed in an integrated tool system without vacuum break.

15. The method of claim 13, wherein the amorphous silicon liner and the dielectric inner spacer are formed at a temperature in a range of from 400° C. to 650° C.

16. The method of claim 13, wherein each of the amorphous silicon liner and the dielectric inner spacer are substantially free of seams and/or voids.

17. The method of claim 13, wherein the amorphous silicon liner has a thickness in a range of from 0.5 nm to 3 nm.

18. The method of claim 13, wherein the dielectric inner spacer comprises a low-K dielectric material having a K-value of in a range of from 3 to 5.

19. The method of claim 18, wherein the low-κ dielectric material comprises one or more of silicon oxycarbide (SiOC) or silicon oxynitride (SiON).

20. The method of claim 12, further comprising forming a high-k dielectric material on the ILD.

* * * * *